United States Patent
Geshi et al.

(10) Patent No.: US 11,699,985 B2
(45) Date of Patent: Jul. 11, 2023

(54) LAYERED BODY, AND SAW DEVICE

(71) Applicant: SUMITOMO ELECTRIC INDUSTRIES, LTD., Osaka (JP)

(72) Inventors: Keiichirou Geshi, Osaka (JP); Masato Hasegawa, Osaka (JP); Shigeru Nakayama, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 497 days.

(21) Appl. No.: 16/754,779

(22) PCT Filed: Sep. 21, 2018

(86) PCT No.: PCT/JP2018/034964
§ 371 (c)(1),
(2) Date: Apr. 9, 2020

(87) PCT Pub. No.: WO2019/073783
PCT Pub. Date: Apr. 18, 2019

(65) Prior Publication Data
US 2020/0304099 A1    Sep. 24, 2020

(30) Foreign Application Priority Data
Oct. 12, 2017 (JP) .................. 2017-198780

(51) Int. Cl.
*H03H 9/25* (2006.01)
*H03H 9/08* (2006.01)
(Continued)

(52) U.S. Cl.
CPC .......... *H03H 9/08* (2013.01); *H03H 9/02559* (2013.01); *H03H 9/02574* (2013.01); *H03H 9/145* (2013.01); *H03H 9/25* (2013.01)

(58) Field of Classification Search
CPC ............ H03H 9/08; H03H 9/25; H03H 9/145; H03H 9/02559
See application file for complete search history.

(56) References Cited

U.S. PATENT DOCUMENTS 5,446,330 A   8/1995 Eda et al.
5,807,626 A   9/1998 Naba
(Continued)

FOREIGN PATENT DOCUMENTS

CN   1152371 A    6/1997
CN   103492345 A  1/2014
(Continued)

OTHER PUBLICATIONS

Geshi, Keiichirou, et al., "Layered Body, and Saw Device," U.S. Appl. No. 16/754,811, filed Apr. 9, 2020, including as-filed specification, claims, abstract and drawings, 23 pages.
(Continued)

*Primary Examiner* — J. San Martin
(74) *Attorney, Agent, or Firm* — Faegre Drinker Biddle & Reath LLP

(57) ABSTRACT

A ceramic substrate is formed of polycrystalline ceramic and has a supporting main surface. At the supporting main surface of the ceramic substrate, the mean of grain sizes of the polycrystalline ceramic is 15 μm or more and less than 40 μm and the standard deviation of the grain sizes is less than 1.5 times the mean.

8 Claims, 5 Drawing Sheets

(51) Int. Cl.
*H03H 9/02* (2006.01)
*H03H 9/145* (2006.01)

(56) References Cited

U.S. PATENT DOCUMENTS

| | | | |
|---|---|---|---|
| 5,998,907 A | 12/1999 | Taguchi et al. | |
| 2002/0102441 A1 | 8/2002 | Shinosawa et al. | |
| 2004/0104978 A1 | 6/2004 | Iwashita et al. | |
| 2007/0127140 A1* | 6/2007 | Reichel | G02B 1/02 |
| | | | 359/754 |
| 2016/0049469 A1 | 2/2016 | Yoshikawa et al. | |
| 2016/0280604 A1* | 9/2016 | Nobori | C04B 35/62685 |
| 2016/0293831 A1 | 10/2016 | Fukuoka et al. | |
| 2017/0279435 A1 | 9/2017 | Geshi et al. | |
| 2019/0103550 A1 | 4/2019 | Kobayashi et al. | |

FOREIGN PATENT DOCUMENTS

| | | |
|---|---|---|
| CN | 103503130 A | 1/2014 |
| EP | 3315476 A1 | 5/2018 |
| JP | H10-316466 A | 12/1998 |
| JP | H11-55070 A | 2/1999 |
| JP | 2001-220227 A | 8/2001 |
| JP | 2007-108734 A | 4/2007 |
| JP | 2009-23908 A | 2/2009 |
| JP | 2011-66818 A | 3/2011 |
| JP | 2016-100729 A | 5/2016 |
| JP | 2017-95333 A | 6/2017 |
| JP | 2017-152870 A | 8/2017 |
| JP | 2017-175618 A | 9/2017 |
| WO | WO-2014/192597 A1 | 12/2014 |
| WO | WO-2016/208766 A1 | 12/2016 |

OTHER PUBLICATIONS

U.S. Office Action dated Jul. 6, 2022 issued in U.S. Appl. No. 16/754,811.
U.S. Office Action dated Dec. 12, 2022 in U.S. Appl. No. 16/754,811.
Notice of Allowance dated Feb. 23, 2023 in U.S. Appl. No. 16/754,811.

* cited by examiner

LAYERED BODY, AND SAW DEVICE

TECHNICAL FIELD

The present disclosure relates to a ceramic substrate, a layered body, and a SAW device.

The present application claims the priority based on Japanese Patent Application No. 2017-198780 filed on Oct. 12, 2017, the entire contents of which are incorporated herein by reference.

BACKGROUND ART

SAW devices (surface acoustic wave devices) are installed in communication apparatuses such as cellular phones in order to remove noises included in electrical signals. SAW devices have a structure in which electrodes are formed on a piezoelectric substrate. To radiate heat during operation, the piezoelectric substrate is disposed on a base substrate formed of a material with good heat radiation properties.

For example, a substrate formed of single-crystalline sapphire can be employed as the base substrate. However, if such a substrate formed of single-crystalline sapphire is employed as the base substrate, the production cost of SAW devices increases. To address this problem, there has been proposed a SAW device having a structure in which a ceramic substrate formed of polycrystalline spinel is employed as a base substrate, and a piezoelectric substrate and the ceramic substrate are bonded to each other through Van der Waals force (e.g., refer to PTL 1).

CITATION LIST

Patent Literature

PTL 1: Japanese Unexamined Patent Application Publication No. 2011-66818

SUMMARY OF INVENTION

The ceramic substrate according to the present disclosure is a ceramic substrate formed of polycrystalline ceramic and having a supporting main surface. At the supporting main surface, the mean of grain sizes of the polycrystalline ceramic is 15 μm or more and less than 40 μm and the standard deviation of the grain sizes is less than 1.5 times the mean.

DESCRIPTION OF EMBODIMENTS

Figure 1:
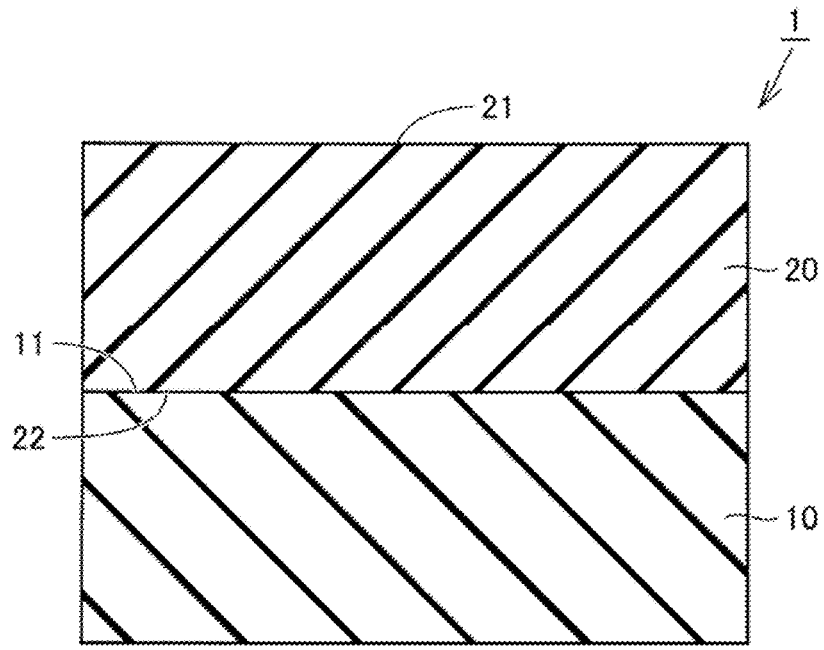
FIG. 1 is a schematic sectional view illustrating a structure of a layered body including a ceramic substrate and a piezoelectric substrate.

Problems to be Solved by Present Disclosure

When a ceramic substrate and a piezoelectric substrate have an insufficient bonding strength, the ceramic substrate and the piezoelectric substrate are separated from each other in the production process of SAW devices, which decreases the yield in the production of SAW devices. To further reduce the production cost of SAW devices, the bonding strength between the ceramic substrate and the piezoelectric substrate needs to be further increased.

Accordingly, it is an object to provide a ceramic substrate that can be bonded to a piezoelectric substrate with a sufficient bonding strength, and a layered body and a SAW device including the ceramic substrate.

Advantageous Effects of Present Disclosure

According to the ceramic substrate of the present disclosure, a ceramic substrate that can be bonded to a piezoelectric substrate with a sufficient bonding strength can be provided.

Description of Embodiments of Present Disclosure

First, embodiments of the present disclosure will be listed and described. The ceramic substrate according to the present disclosure is a ceramic substrate formed of polycrystalline ceramic and having a supporting main surface. In this ceramic substrate, at the supporting main surface, the mean of grain sizes of the polycrystalline ceramic is 15 μm or more and less than 40 μm and the standard deviation of the grain sizes is less than 1.5 times the mean.

According to studies conducted by the present inventors, the bonding strength between the ceramic substrate and the piezoelectric substrate can be improved by controlling the mean of grain sizes at the supporting main surface of the ceramic substrate to 15 μm or more and less than 40 μm. However, even if the mean of grain sizes at the supporting main surface is 15 μm or more and less than 40 μm, the ceramic substrate and the piezoelectric substrate sometimes have an insufficient bonding strength. As a result of further studies on this cause, it is found that even if the mean of grain sizes at the supporting main surface is 15 μm or more and less than 40 μm, the ceramic substrate and the piezoelectric substrate have an insufficient bonding strength when the variation in grain size is large, more specifically, when the standard deviation of the grain sizes is more than or equal to 1.5 times the mean. Therefore, in addition to controlling the mean of grain sizes at the supporting main surface to 15 μm or more and less than 40 μm, the standard deviation of the grain sizes needs to be less than 1.5 times the mean to bond the ceramic substrate and the piezoelectric substrate to each other with a sufficient bonding strength.

In the ceramic substrate according to the present disclosure, the mean of grain sizes of the polycrystalline ceramic at the supporting main surface is 15 μm or more and less than 40 μm and the standard deviation of the grain sizes is less than 1.5 times the mean. As a result, according to the ceramic substrate of the present disclosure, a ceramic substrate can be bonded to a piezoelectric substrate with a sufficient bonding strength.

In the above ceramic substrate, the residual stress at the supporting main surface may be −300 MPa or more and 300 MPa or less. In the production process of SAW devices, a layered body in which the ceramic substrate and the piezoelectric substrate are bonded to each other is subjected to a heat cycle including heating and cooling. This may result in an insufficient bonding strength between the ceramic substrate and the piezoelectric substrate. When the absolute value of the residual stress at the supporting main surface is 300 MPa or less, the sufficient bonding strength is easily maintained even if such a heat cycle is applied. For the residual stress, a negative value indicates compressive stress and a positive value indicates tensile stress. The residual stress can be measured with, for example, an X-ray diffractometer.

The above ceramic substrate may be formed of at least one material selected from the group consisting of spinel ($MgAl_2O_4$), alumina ($Al_2O_3$), magnesia (MgO), silica ($SiO_2$), mullite ($3Al_2O_3 \cdot 2SiO_2$), cordierite ($2MgO \cdot 2Al_2O_3 \cdot 5SiO_2$), calcia (CaO), titania ($TiO_2$), silicon nitride ($Si_3N_4$), aluminum nitride (AlN), and silicon carbide (SiC). These materials are suitable as materials for the ceramic substrate according to the present disclosure. Among these materials, spinel is preferred.

A layered body according to the present disclosure includes the above ceramic substrate according to the present disclosure and a piezoelectric substrate formed of a piezoelectric material and having a bonding main surface. The supporting main surface of the ceramic substrate and the bonding main surface of the piezoelectric substrate are bonded to each other through Van der Waals force. The layered body according to the present disclosure includes the ceramic substrate according to the present disclosure. Therefore, according to the layered body of the present disclosure, the ceramic substrate and the piezoelectric substrate can be bonded to each other with a sufficient bonding strength.

In the above layered body, the piezoelectric substrate may be formed of lithium tantalate ($LiTaO_3$) or lithium niobate ($LiNbO_3$). These materials are suitable as materials for the piezoelectric substrate in the layered body according to the present disclosure.

A SAW device according to the present disclosure includes the layered body according to the present disclosure and an electrode formed on a main surface of the piezoelectric substrate, the main surface being located opposite to the ceramic substrate. The SAW device according to the present disclosure includes the ceramic substrate according to the present disclosure. Therefore, according to the SAW device of the present disclosure, a SAW device in which the ceramic substrate and the piezoelectric substrate are bonded to each other with a sufficient bonding strength can be provided.

Details of Embodiments of Present Disclosure

Next, a ceramic substrate and a layered body according to embodiments of the present disclosure will be described with reference to the attached drawings. In the drawings, the same or corresponding parts are designated by the same reference numerals, and the description thereof is omitted.

Figure 2:
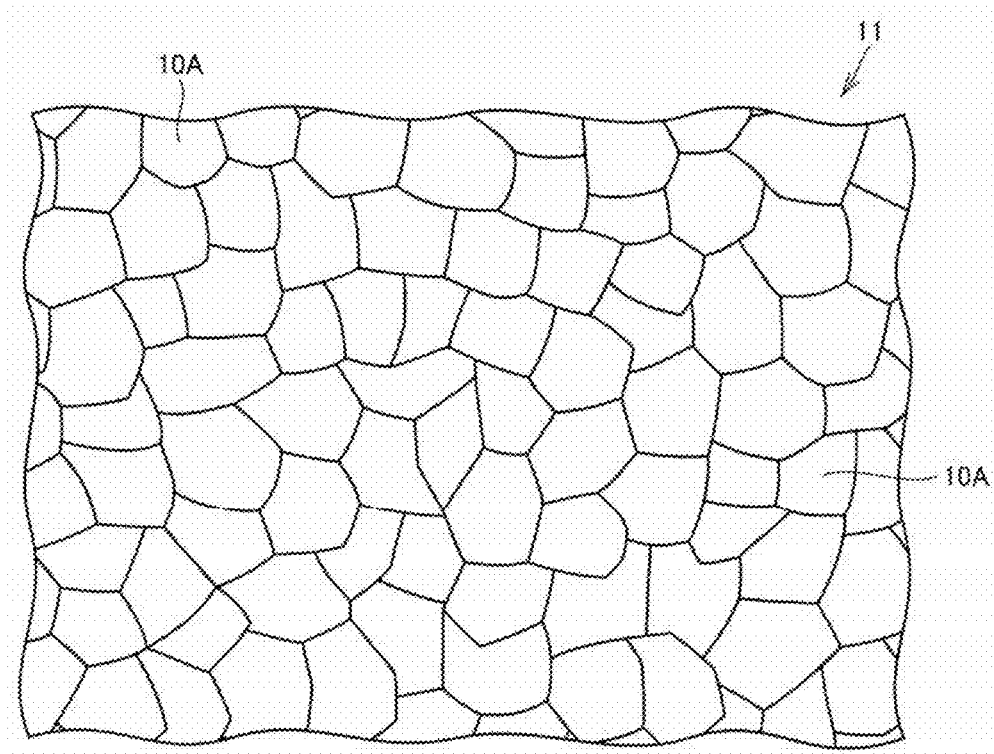
FIG. 2 is a schematic plan view illustrating a supporting main surface of a ceramic substrate.

Referring to FIG. 1 and FIG. 2, a ceramic substrate 10 according to this embodiment is formed of polycrystalline ceramic and has a supporting main surface 11 for supporting a piezoelectric substrate 20 that is another substrate. That is, the ceramic substrate 10 is an aggregate of many grains 10A. As illustrated in FIG. 2, many grains 10A are exposed at the supporting main surface 11. At the supporting main surface 11, the mean of diameters (grain sizes) of the grains 10A is 15 µm or more and less than 40 µm, and the standard deviation of the diameters is less than 1.5 times the mean. The grain size of each of the grains 10A can be determined by, for example, the following method. First, the supporting main surface 11 is observed with a microscope to measure the area of the grain 10A. Then, the diameter of a circle having the measured area is defined as a grain size. The mean of grain sizes can be determined by, for example, observing a plurality of regions of the supporting main surface 11 using a microscope and calculating the arithmetic mean of grain sizes in the regions.

Referring to FIG. 1, a layered body 1 according to this embodiment includes the ceramic substrate 10 and the piezoelectric substrate 20. The piezoelectric substrate 20 is formed of a single-crystalline piezoelectric material such as single-crystalline lithium tantalate or single-crystalline lithium niobate. The ceramic substrate 10 is formed of a polycrystalline ceramic made of at least one material selected from the group consisting of spinel, alumina, magnesia, silica, mullite, cordierite, calcia, titania, silicon nitride, aluminum nitride, and silicon carbide and is preferably formed of a polycrystalline ceramic made of any one of the foregoing materials.

The piezoelectric substrate 20 has an exposed main surface 21 that is one main surface and a bonding main surface 22 that is a main surface opposite to the exposed main surface 21. The piezoelectric substrate 20 is disposed on the supporting main surface 11 of the ceramic substrate 10 so that the bonding main surface 22 is in contact with the supporting main surface 11. The ceramic substrate 10 and the piezoelectric substrate 20 are bonded to each other through Van der Waals force.

For the ceramic substrate 10, the mean of grain sizes of the polycrystalline ceramic at the supporting main surface 11 is 15 µm or more and less than 40 µm, and the standard deviation of the grain sizes is less than 1.5 times the mean. Therefore, the ceramic substrate 10 is a ceramic substrate that can be bonded to the piezoelectric substrate 20 with a sufficient bonding strength. The layered body 1 includes the ceramic substrate 10. Therefore, the layered body 1 is a layered body in which the ceramic substrate 10 and the piezoelectric substrate 20 are bonded to each other with a sufficient bonding strength.

For the ceramic substrate 10, the residual stress at the supporting main surface 11 is preferably −300 MPa or more and 300 MPa or less. When the absolute value of the residual stress at the supporting main surface 11 is 300 MPa or less, a sufficient bonding strength between the ceramic substrate 10 and the piezoelectric substrate 20 can be maintained even if a heat cycle is applied in the production process of SAW devices. The residual stress at the supporting main surface 11 is more preferably −200 MPa or more and 200 MPa or less and further preferably −100 MPa or more and 100 MPa or less.

At the supporting main surface 11 of the ceramic substrate 10, the standard deviation of the grain sizes is more preferably less than 1 time the mean. Thus, the ceramic substrate 10 and the piezoelectric substrate 20 can be bonded to each other with a sufficient bonding strength with more certainty.

Figure 3:
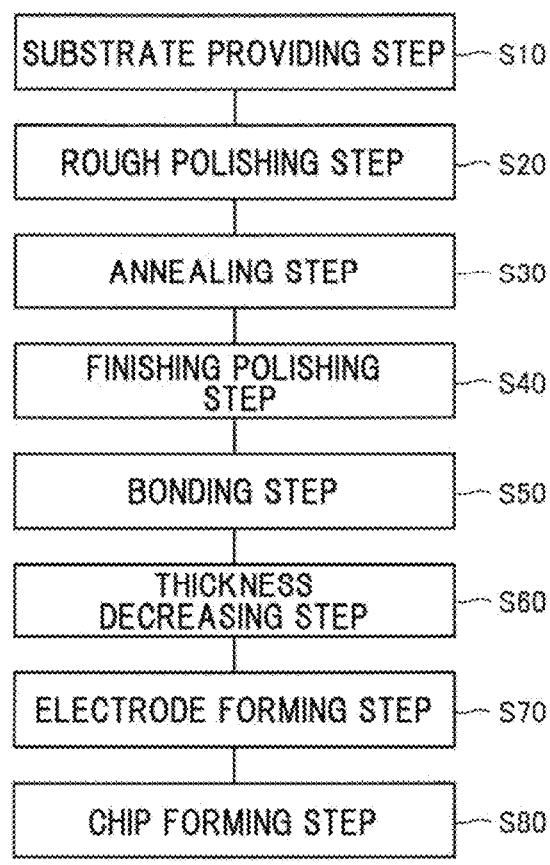
FIG. 3 is a flowchart schematically illustrating a method for producing a ceramic substrate, a layered body, and a SAW device.
Figure 4:
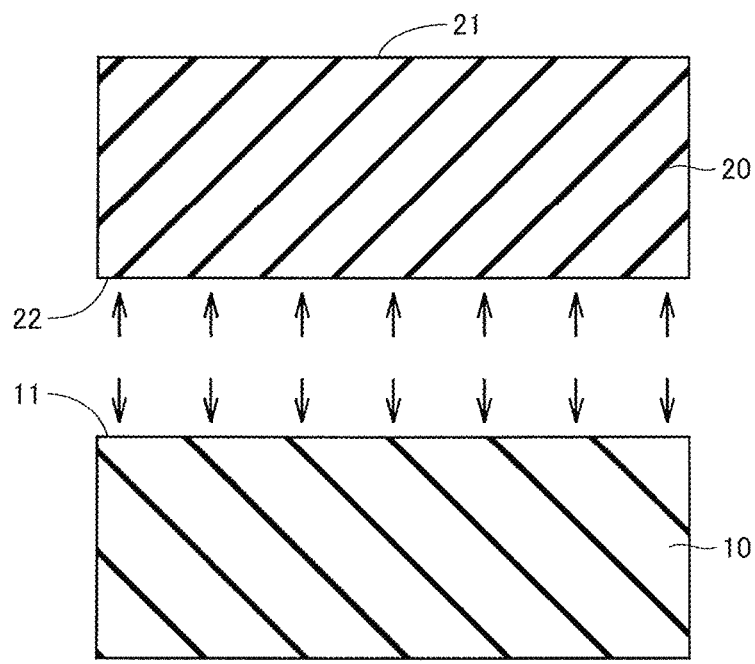
FIG. 4 is a schematic sectional view for describing the method for producing a layered body and a SAW device.

Next, a method for producing a ceramic substrate 10, a layered body 1, and a SAW device 100 according to this embodiment will be described. Referring to FIG. 3, the method for producing a ceramic substrate 10, a layered body 1, and a SAW device 100 according to this embodiment includes a substrate providing step performed first as a step (S10). In the step (S10), referring to FIG. 4, a ceramic substrate 10 formed of a polycrystalline ceramic made of at least one material selected from the group consisting of spinel, alumina, magnesia, silica, mullite, cordierite, calcia, titania, silicon nitride, aluminum nitride, and silicon carbide is provided. For example, a ceramic substrate 10 formed of a polycrystalline ceramic made of one material selected from the above group is provided. Specifically, for example, when a ceramic substrate 10 formed of polycrystalline spinel is provided, a raw material powder is provided by mixing a magnesia powder and an alumina powder, and a molded body is produced by molding the raw material powder. The molded body can be produced by, for example, performing preforming by press molding and then performing CIP (cold isostatic pressing).

Subsequently, a sintering process is performed on the molded body. The sintering process can be performed by a method such as vacuum sintering or HIP (hot isostatic pressing). Thus, a sintered body is obtained. The sintered body is then sliced to obtain a ceramic substrate 10 having a desired shape (thickness) (refer to FIG. 4). Herein, the size of the grains 10A and the variation in size can be adjusted within the desired range by controlling the heating rate during sintering, the sintering temperature, and the holding time during sintering. Specifically, the heating rate can be set to, for example, 0.5° C./min or more and 5° C./min or less. The sintering temperature can be set to, for example, 1500° C. or higher and 2000° C. or lower. The holding time during sintering can be set to, for example, 2 hours or longer and 10 hours or shorter. By controlling the heating rate, the sintering temperature, and the sintering time, the mean of grain sizes is easily controlled to 15 μm or more and less than 40 μm, and the standard deviation of the grain sizes is easily controlled to less than 1.5 times the mean.

Subsequently, a rough polishing step is performed as a step (S20). In the step (S20), referring to FIG. 4, rough polishing treatment is performed on the supporting main surface 11 of the ceramic substrate 10 provided in the step (S10).

Subsequently, an annealing step is performed as a step (S30). In the step (S30), annealing is performed on the ceramic substrate 10. Specifically, for example, the ceramic substrate polished in the step (S20) is heated to a temperature range of 1000° C. or higher and 1500° C. or lower and held for 2 hours or longer and 10 hours or shorter. This decreases the residual stress introduced to the ceramic substrate 10 in the steps (S10) and (S20). As a result, the residual stress at the supporting main surface 11 is easily controlled to −300 MPa or more and 300 MPa or less.

Subsequently, a finishing polishing step is performed as a step (S40). In the step (S40), referring to FIG. 4, finishing polishing treatment is performed on the supporting main surface 11 of the ceramic substrate 10 annealed in the step (S30). Thus, a ceramic substrate 10 according to this embodiment is completed.

Subsequently, a bonding step is performed as a step (S50). In the step (S50), the ceramic substrate 10 subjected to finishing polishing in the step (S40) and a separately provided piezoelectric substrate 20 formed of lithium tantalate or lithium niobate are bonded to each other. Specifically, for example, the ceramic substrate 10 and the piezoelectric substrate 20 are washed, dried, and then inserted into a chamber, and the pressure in the chamber is reduced. As indicated by arrows in FIG. 4, the supporting main surface 11 and the bonding main surface 22 are irradiated with, for example, Ar (argon) beams. This cleans the supporting main surface 11 of the ceramic substrate 10 and the bonding main surface 22 of the piezoelectric substrate 20. Then, the ceramic substrate 10 and the piezoelectric substrate 20 are bonded to each other so that the bonding main surface 22 of the piezoelectric substrate 20 is in contact with the supporting main surface 11 of the ceramic substrate 10. Thus, the ceramic substrate 10 and the piezoelectric substrate 20 are bonded to each other through Van der Waals force. As a result, a layered body 1 according to this embodiment is obtained.

Figure 5:
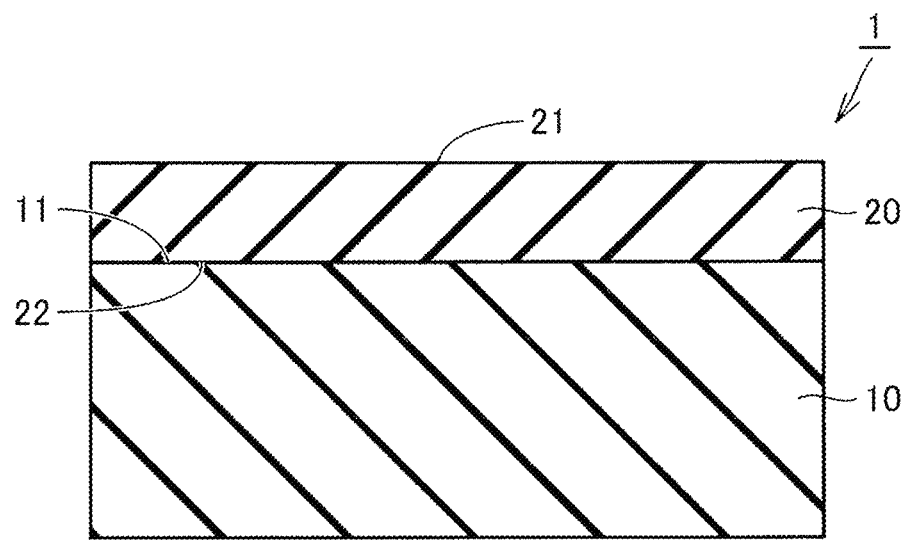
FIG. 5 is a schematic sectional view for describing the method for producing a layered body and a SAW device.

Next, a method for producing a SAW device including the layered body 1 including the ceramic substrate 10 will be described. Referring to FIG. 3, after the step (S50), a thickness decreasing step is performed as a step (S60). In the step (S60), referring to FIG. 1 and FIG. 5, the thickness of the piezoelectric substrate 20 of the layered body 1 obtained in the step (S50) is decreased. Specifically, for example, an exposed main surface 21 of the piezoelectric substrate 20 is subjected to grinding treatment. Thus, the thickness of the piezoelectric substrate 20 is decreased to a thickness appropriate for SAW devices.

Figure 6:
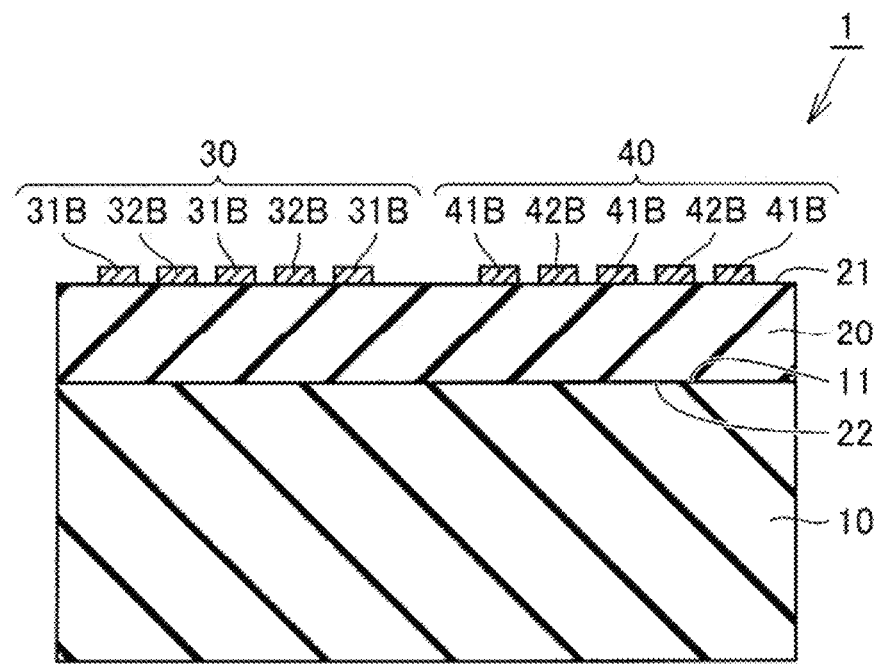
FIG. 6 is a schematic sectional view for describing the method for producing a layered body and a SAW device.
Figure 7:
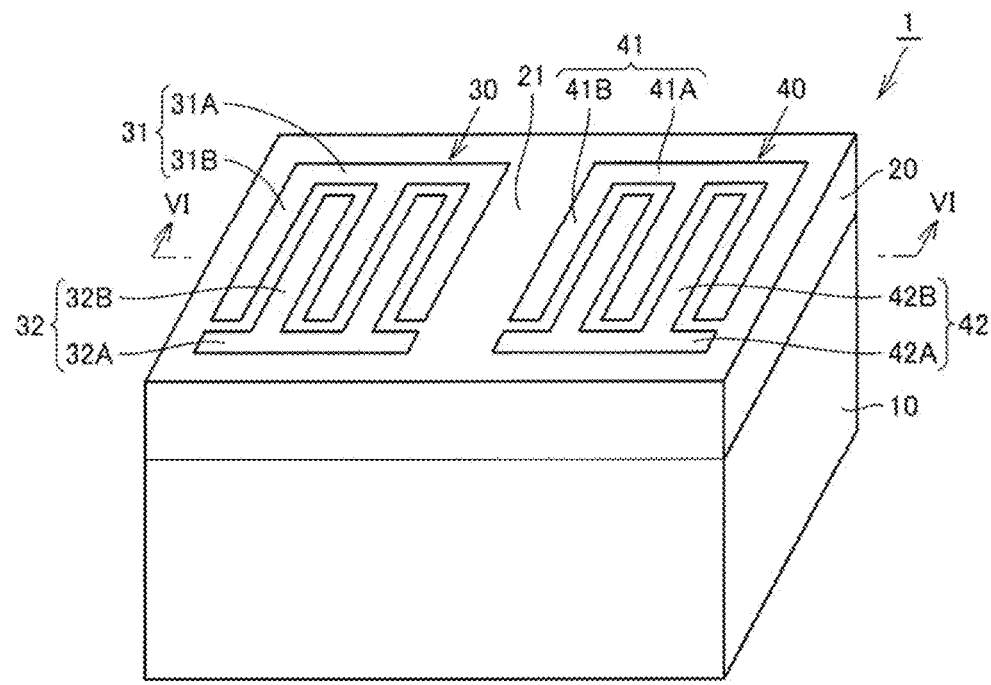
FIG. 7 is a schematic view for describing the method for producing a layered body and a SAW device.

Subsequently, an electrode forming step is performed as a step (S70). In the step (S70), referring to FIG. 5 to FIG. 7, comb-shaped electrodes are formed on the exposed main surface 21 of the piezoelectric substrate 20. FIG. 6 is a sectional view taken along line VI-VI in FIG. 7. Specifically, referring to FIG. 6 and FIG. 7, a conductor film made of an electric conductor such as Al is formed on the exposed main surface 21 of the piezoelectric substrate 20 whose thickness has been appropriately adjusted in the step (S60). The conductor film can be formed by, for example, a sputtering method. A resist is then applied onto the conductor film to form a resist film. By performing exposure and development, an opening is formed in a region other than regions corresponding to desired shapes of input-side electrodes 30 and output-side electrodes 40. For example, wet etching is performed using the resist film having the opening formed therein as a mask to form a plurality of pairs of input-side electrodes 30 and output-side electrodes 40 as illustrated in FIG. 6 and FIG. 7. FIG. 6 and FIG. 7 illustrate a region corresponding to a pair of input-side electrode 30 and output-side electrode 40. The electrode interval of the comb-shaped electrode in the input-side electrode 30 and the output-side electrode 40 can be appropriately determined in accordance with the frequency of signals to be output.

Subsequently, a chip forming step is performed as a step (S80). In the step (S80), the layered body 1 on which a plurality of pairs of input-side electrodes 30 and output-side electrodes 40 have been formed is cut in a thickness direction into a plurality of chips each including a pair of input-side electrode 30 and output-side electrode 40.

Figure 8:
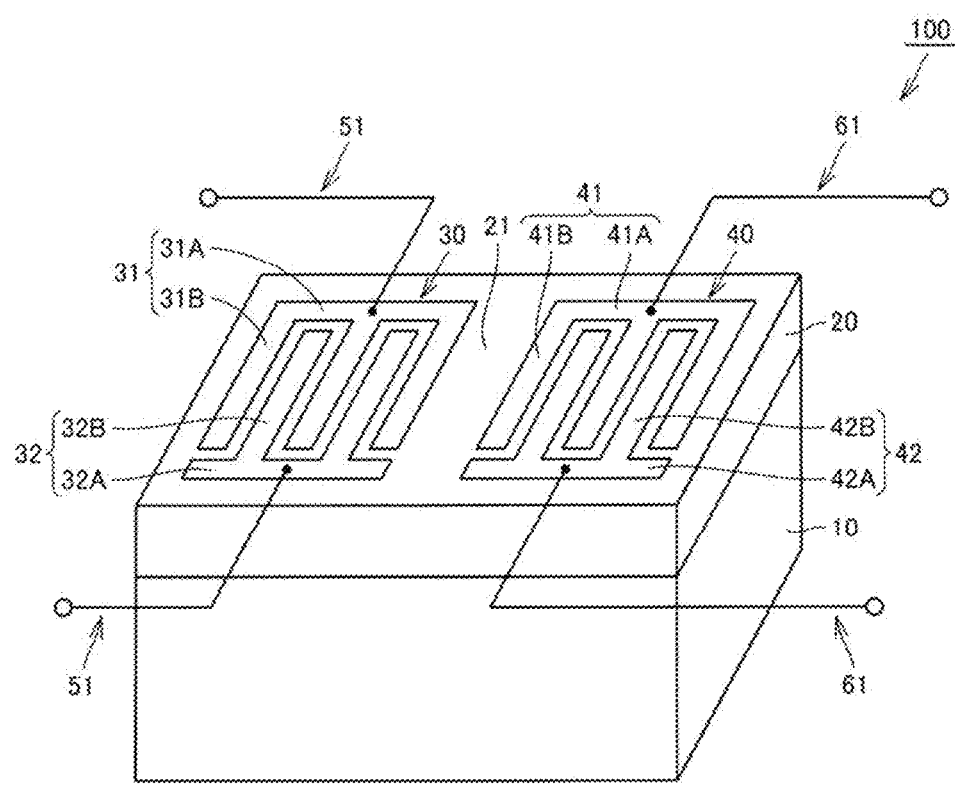
FIG. 8 is a schematic view illustrating a structure of a SAW device.

Referring to FIG. 7 and FIG. 8, an input-side wiring line 51 and an output-side wiring line 61 are then formed on the chip produced in the step (S80) to complete a SAW device 100 (SAW filter) according to this embodiment.

In the production method of the SAW device 100 according to this embodiment, the mean of grain sizes of the polycrystalline ceramic at the supporting main surface 11 of the ceramic substrate 10 is 15 μm or more and less than 40 μm and the standard deviation of the grain sizes is less than 1.5 times the mean. Therefore, the ceramic substrate 10 and the piezoelectric substrate 20 are bonded to each other with a sufficient bonding strength. This suppresses the separation between the ceramic substrate and the piezoelectric substrate in the production process of SAW devices, which increases the yield in the production of SAW devices. Note that another annealing step may be performed again after the step (S40) from the viewpoint of further decreasing the absolute value of the residual stress at the supporting main surface 11.

Referring to FIG. 8, the SAW device 100 according to this embodiment includes the layered body 1 including the ceramic substrate 10 and the piezoelectric substrate 20 that bond to each other through Van der Waals force, the input-side electrode 30 and the output-side electrode 40, which are a pair of comb-shaped electrodes formed so as to be in contact with the exposed main surface 21 of the piezoelectric substrate 20, the input-side wiring line 51 connected to the input-side electrode 30, and the output-side wiring line 61 connected to the output-side electrode 40.

The input-side electrode 30 includes a first portion 31 and a second portion 32. The first portion 31 includes a linear base portion 31A and a plurality of linear protrusions 31B that protrude from the base portion 31A in a direction perpendicular to the direction in which the base portion 31A extends. The second portion 32 includes a linear base portion 32A that extends in parallel with the base portion 31A and a plurality of linear protrusions 32B that protrude from the base portion 32A in a direction perpendicular to the direction in which the base portion 32A extends and that fit into gaps between adjacent protrusions 31B. The protrusions 31B and the protrusions 32B are disposed at predetermined evenly spaced intervals.

The output-side electrode 40 includes a first portion 41 and a second portion 42. The first portion 41 includes a linear base portion 41A and a plurality of linear protrusions 41B that protrude from the base portion 41A in a direction perpendicular to the direction in which the base portion 41A extends. The second portion 42 includes a linear base portion 42A that extends in parallel with the base portion 41A and a plurality of linear protrusions 42B that protrude from the base portion 42A in a direction perpendicular to the direction in which the base portion 42A extends and that fit into gaps between adjacent protrusions 41B. The protrusions 41B and the protrusions 42B are disposed at predetermined evenly spaced intervals.

When an AC voltage serving as an input signal is applied to the input-side electrode 30 through the input-side wiring line 51, a surface acoustic wave is generated on the exposed main surface 21 (surface) of the piezoelectric substrate 20 because of a piezoelectric effect, and the surface acoustic wave propagates to the output-side electrode 40. Herein, the input-side electrode 30 and the output-side electrode 40 have a comb shape as illustrated in FIG. 8, and the protrusions 31B and the protrusions 32B are evenly spaced and the protrusions 41B and the protrusions 42B are evenly spaced. Thus, in a direction from the input-side electrode 30 toward the output-side electrode 40, regions in which electrodes are formed on the exposed main surface 21 of the piezoelectric substrate 20 are present at a predetermined period (electrode period). Therefore, the surface acoustic wave generated by the input signal is excited most when its wavelength is coincident with the electrode period, and is attenuated as the difference between the wavelength and the electrode period increases. Consequently, only a signal with a wavelength close to the electrode period is output through the output-side electrode 40 and the output-side wiring line 61.

In the above operation, the temperature of the piezoelectric substrate 20 increases. In the SAW device 100 according to this embodiment, the ceramic substrate 10 made of a material having good heat radiation properties is disposed so as to be in contact with the piezoelectric substrate 20. Therefore, the SAW device 100 has high reliability. Furthermore, since the SAW device 100 includes the ceramic substrate 10 according to this embodiment, the separation between the ceramic substrate 10 and the piezoelectric substrate 20 is suppressed in the production process. Consequently, the SAW device 100 can be produced while a high yield is maintained.

EXAMPLES

Samples of 11 ceramic substrates (spinel substrates) having different means and standard deviations of grain sizes at a supporting main surface and different residual stresses at the supporting main surface were provided (sample Nos. 1 to 11). After the steps (S10) to (S50) of the above embodiment were performed using the samples, the bonding strength between the ceramic substrate and the piezoelectric substrate in the layered body 1 was evaluated by a crack opening method. Furthermore, after the samples were subjected to a heat cycle including heating from room temperature to 300° C. and then cooling to room temperature, the bonding strength was evaluated in the same manner.

The grain size was measured by observing a polished supporting main surface with a microscope ECLIPSE LV100 manufactured by Nikon Corp. The mean and standard deviation of grain sizes were calculated using image processing software included with the microscope. The residual stress at the supporting main surface was measured by X-ray diffraction stress measurement. The X-ray used was Cu-Kα line focus. The excitation conditions were 45 kV and 40 mA. The scanning method was a $\sin^2\Psi$ method (ISO-inclination method). The measurement range was $2\theta=93°$ to $95.5°$. The step size was $0.03°$. The $\Psi$ conditions were 13 levels (6 levels on positive side, one level at zero, 6 levels on negative side) $\{0 \leq \sin^2\Psi \leq 0.5\}$. The integration time was 1 or 3 seconds. The measurement plane was an $MgAl_2O_4$ (731) plane. Table 1 shows the experimental results.

TABLE 1

| No. | Mean μ of grain sizes (μm) | Standard deviation σ of grain sizes (μm) | σ/μ | Residual stress (MPa) | Bonding strength | Bonding strength after heat cycle |
|---|---|---|---|---|---|---|
| 1 | 12 | 10 | 0.83 | −100 | C | C |
| 2 | 15 | 25 | 1.67 | 100 | C | C |
| 3 | 15 | 20 | 1.33 | 450 | A | B |
| 4 | 15 | 15 | 1.00 | −250 | A | A |
| 5 | 25 | 40 | 1.60 | −150 | C | C |
| 6 | 25 | 30 | 1.20 | −350 | A | B |
| 7 | 25 | 35 | 1.40 | 300 | A | A |
| 8 | 37 | 60 | 1.62 | −50 | C | C |
| 9 | 37 | 40 | 1.08 | −550 | A | B |
| 10 | 37 | 40 | 1.08 | −150 | A | A |
| 11 | 42 | 40 | 0.95 | −100 | C | C |

In Table 1, the bonding strength and the bonding strength after heat cycle were evaluated with grades of A: 1.0 J/m² or more, B: 0.5 J/m² or more and less than 1.0 J/m², and C: less than 0.5 J/m².

Table 1 shows that the samples 1 and 11 in which the mean of grain sizes at the supporting main surface is outside the range of 15 μm or more and less than 40 μm have an evaluation result of C in terms of bonding strength. This supports that the mean of grain sizes at the supporting main surface needs to be in the range of 15 μm or more and less than 40 μm. Even if the mean of grain sizes is within the range of 15 μm or more and less than 40 μm, the samples (samples 2, 5, and 8) in which the ratio (σ/μ) of the standard deviation of grain sizes to the mean of grain sizes is 1.5 or more have an evaluation result of C in terms of bonding strength. This shows that to achieve a sufficient bonding strength, the standard deviation of grain sizes needs to be less than 1.5 times the mean in addition to the above mean condition.

Furthermore, even if the above-described mean and standard deviation conditions are satisfied, the samples (samples 3, 6, and 9) in which the residual stress at the supporting main surface is outside the range of −300 MPa or more and 300 MPa or less have an evaluation result of B in terms of bonding strength after heat cycle whereas the samples in which the residual stress is within the range of −300 MPa or more and 300 MPa or less have an evaluation result of A in terms of bonding strength after heat cycle. This confirms that when the absolute value of the residual stress at the supporting main surface is 300 MPa or less, the bonding strength after heat cycle is improved.

The embodiments and Examples disclosed herein are mere examples in all respects and should be understood as being non-limitative in any perspective. The scope of the present invention is defined not by the above description but by Claims. The scope of the present invention is intended to embrace all the modifications within the meaning and range of equivalency of the Claims.

The invention claimed is:

1. A layered body comprising:
   a ceramic substrate formed of polycrystalline ceramic and having a supporting main surface; and
   a piezoelectric substrate formed of a piezoelectric material and having a bonding main surface in contact with the supporting main surface of the ceramic substrate,
   wherein at the supporting main surface, a mean of grain sizes of the polycrystalline ceramic is 15 μm or more and less than 40 μm, and
   a standard deviation of the grain sizes is less than 1.5 times the mean.

2. The layered body according to claim 1, wherein a residual stress at the supporting main surface is −300 MPa or more and 300 MPa or less.

3. The layered body according to claim 1, wherein the ceramic substrate is formed of at least one material selected from the group consisting of spinel, alumina, magnesia, silica, mullite, cordierite, calcia, titania, silicon nitride, aluminum nitride, and silicon carbide.

4. The layered body according to claim 1, wherein the polycrystalline ceramic is formed of spinel.

5. The layered body according to claim 1,
   wherein a residual stress at the supporting main surface is −300 MPa or more and 300 MPa or less, and
   the polycrystalline ceramic is formed of spinel.

6. The layered body according to claim 1,
   wherein the supporting main surface of the ceramic substrate and the bonding main surface of the piezoelectric substrate are bonded to each other through Van der Waals force.

7. The layered body according to claim 6, wherein the piezoelectric substrate is formed of lithium tantalate or lithium niobate.

8. A SAW device comprising:
   the layered body according to claim 6; and
   an electrode formed on a main surface of the piezoelectric substrate, the main surface being located opposite to the ceramic substrate.

\* \* \* \* \*